United States Patent [19]

Ko et al.

[11] Patent Number: 5,727,624
[45] Date of Patent: Mar. 17, 1998

[54] CPU HEAT DISSIPATING DEVICE WITH AIRGUIDING UNITS

[75] Inventors: Chun-Chin Ko; Chai-Fong Kao, both of Taipei, Taiwan

[73] Assignee: Liken Lin, Taipei Hsien, Taiwan

[21] Appl. No.: 820,777

[22] Filed: Mar. 18, 1997

[51] Int. Cl.$^6$ ...................................................... H05K 7/20
[52] U.S. Cl. .......................... 165/121; 165/80.3; 361/697
[58] Field of Search ................................ 165/80.3, 121, 165/122, 185; 361/697; 415/177, 178

[56] References Cited

U.S. PATENT DOCUMENTS

| | | | |
|---|---|---|---|
| 5,288,203 | 2/1994 | Thomas | 415/178 |
| 5,421,402 | 6/1995 | Lin | 165/80.3 |
| 5,484,262 | 1/1996 | Thomas et al. | 415/178 |
| 5,495,392 | 2/1996 | Shen | 361/697 |
| 5,526,875 | 6/1996 | Lin | 165/80.3 |
| 5,566,749 | 10/1996 | Jordan et al. | 165/80.3 |
| 5,582,506 | 12/1996 | Hong | 415/177 |
| 5,594,623 | 1/1997 | Schwegler | 361/697 |
| 5,650,912 | 7/1997 | Katsui et al. | 361/697 |

Primary Examiner—Allen J. Flanigan
Attorney, Agent, or Firm—Merchant, Gould, Smith, Edell, Welter & Schmidt

[57] ABSTRACT

A CPU heat dissipating device includes a heat-conducting base plate adapted to be mounted on a CPU and having a flat top surface, an annular fin unit mounted on the top surface of the base plate and projecting integrally and upwardly from the entire outer periphery of the base plate, an air-drawing fan mounted on the top surface of the base plate and located inside the annular fin unit, and a guide plate fixed on the base plate and located immediately over the annular fin unit so as to cover the annular fin unit. The guide plate has an opening which is formed therethrough and located immediately over the fan, and an annular flange which projects integrally and upwardly from the base plate and which is located around and adjacent to the opening so as to guide cooling air to flow onto the top surface of the base plate in a direction perpendicular to the top surface of the base plate, thereby reducing turbulence between the base plate and the guide plate. The annular fin unit has a row of generally parallel rib-shaped radiating fins so as to guide hot air to depart from the base plate in a certain direction.

5 Claims, 4 Drawing Sheets

# CPU HEAT DISSIPATING DEVICE WITH AIRGUIDING UNITS

BACKGROUND OF THE INVENTION

1. Field of the Invention

This invention relates to a CPU heat dissipating device, more particularly to a CPU heat dissipating device which has a cooling-air guiding unit so as to reduce turbulence of air on the device.

2. Description of the Related Art

A known CPU heat dissipating device consists of only one air-drawing fan which blows cooling air onto the CPU at a speed of about 5,000 RPM. As illustrated in FIG. 1, after this device is used under a room temperature of 25° C. for about an hour, the CPU is at a temperature of about 88° C.

FIG. 2 shows another conventional CPU heat dissipating device (A) which includes a base plate (A1) made of Aluminum and adapted to be fixed on a CPU (C1), an air-drawing fan (A2) fixed on the central portion of the base plate (A1), and a plurality of generally cylindrical radiating fins (A3) projecting integrally and upwardly from the base plate (A1) and surrounding the fan (A2). Cooling air can be drawn onto the base plate (A1) in different directions, as indicated by the arrows, thereby forming turbulence of air on the base plate (A1). As illustrated in FIG. 3, after the device of FIG. 2 is used under a room temperature of 25° C. for about an hour, the CPU is at a temperature of about 64° C.

FIG. 4 shows still another conventional CPU heat dissipating device (B) which includes a base plate (B1) made of Aluminum and adapted to be fixed on a CPU (not shown), a guide plate (B2) fixed on a side portion of the base plate (B1) so as to define three parallel hot-air passages (B3) between the guide plate (B2) and the base plate (B1), and a plurality of generally cylindrical radiating fins (B4) projecting integrally and upwardly from the base plate (B1). No fan is used with the device of FIG. 4 so that natural air circulation occurs within the hot-air passages (B3), thereby guiding a little of hot air to depart from the base plate (B1) via the passages (B3) in a direction, as indicated by the arrows. As illustrated in FIG. 5, after the device of FIG. 4 is used under a room temperature of 25° C. for about an hour, the CPU is at a temperature of about 74° C.

Because no efficient air guiding units are provided on the above-mentioned prior art devices, cooling air cannot flow quickly onto the radiating fins and hot air cannot depart quickly from the radiating fins, thus reducing the heat dissipating effect.

SUMMARY OF THE INVENTION

An object of this invention is to provide a CPU heat dissipating device with air-guiding units which minimize turbulence of air on the device so as to increase the heat dissipating effect.

According to this invention, a CPU heat dissipating device includes a heat-conducting base plate adapted to be mounted on a CPU and having a flat top surface, an annular fin unit mounted on the top surface of the base plate and projecting integrally and upwardly from the entire outer periphery of the base plate, an air-drawing fan mounted on the top surface of the base plate and located inside the annular fin unit, and a guide plate fixed on the base plate so as to cover the annular fin unit and located immediately over the annular fin unit. The guide plate has an opening which is formed therethrough and located immediately over the fan, and an annular flange which projects integrally and upwardly from the base plate and which is located around and adjacent to the opening so as to guide cooling air to flow onto the top surface of the base plate in a direction perpendicular to the top surface of the base plate, thereby reducing turbulence between the base plate and the guide plate. The annular fin unit has a row of generally parallel rib-shaped radiating fins so as to guide hot air to depart from the base plate in a certain direction. Accordingly, hot air can depart quickly from the fin unit.

BRIEF DESCRIPTION OF THE DRAWINGS

Other features and advantages of this invention will become apparent in the following detailed description of the preferred embodiment of this invention with reference to the accompanying drawings, in which.

DETAILED DESCRIPTION OF THE PREFERRED EMBODIMENT

Figure 1:
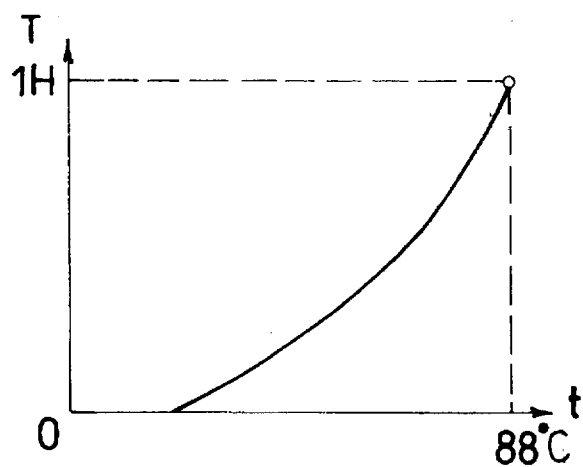
FIG. 1 is a diagram illustrating the relationship between the temperature of a CPU and the dissipating time of a conventional CPU heat dissipating device which is applied to the CPU, wherein (T) represents the time, and (t) represents the temperature.
Figure 2:
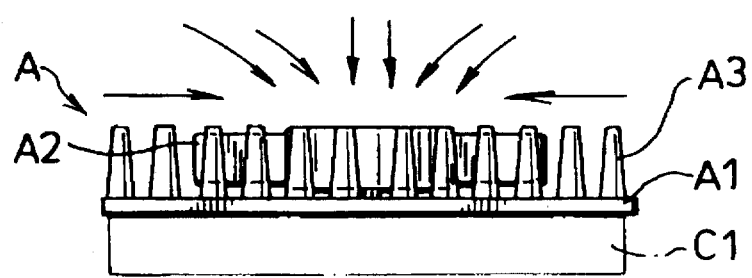
FIG. 2 illustrates another conventional CPU heat dissipating device.
Figure 3:
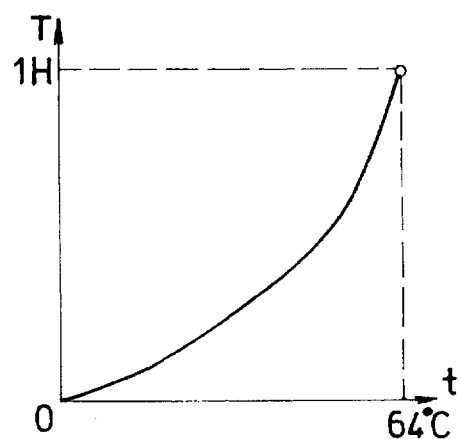
FIG. 3 is a diagram illustrating the relationship between the dissipating time of the CPU heat dissipating device of FIG. 2 and the temperature of a CPU to which the device of FIG. 2 is applied, wherein (T) represents the time, and (t) represents the temperature.
Figure 4:
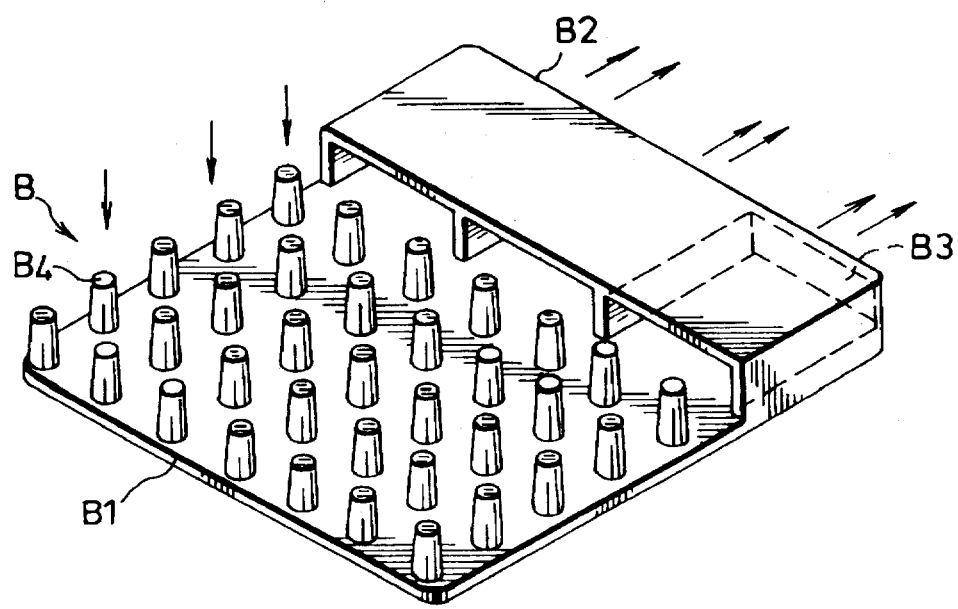
FIG. 4 illustrates still another conventional CPU heat dissipating device.
Figure 5:
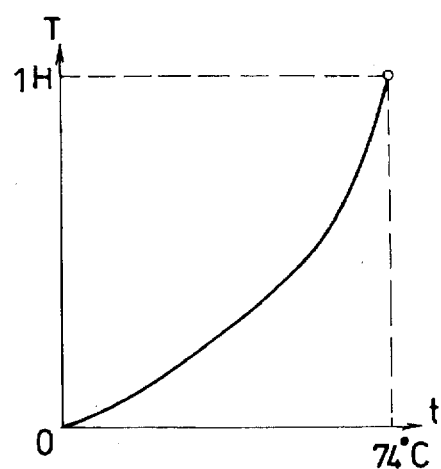
FIG. 5 is a diagram illustrating the relationship between the dissipating time of the CPU heat dissipating device of FIG. 4 and the temperature of a CPU to which the device of FIG. 4 is applied, wherein (T) represents the time, and (t) represents the temperature.
Figure 6:
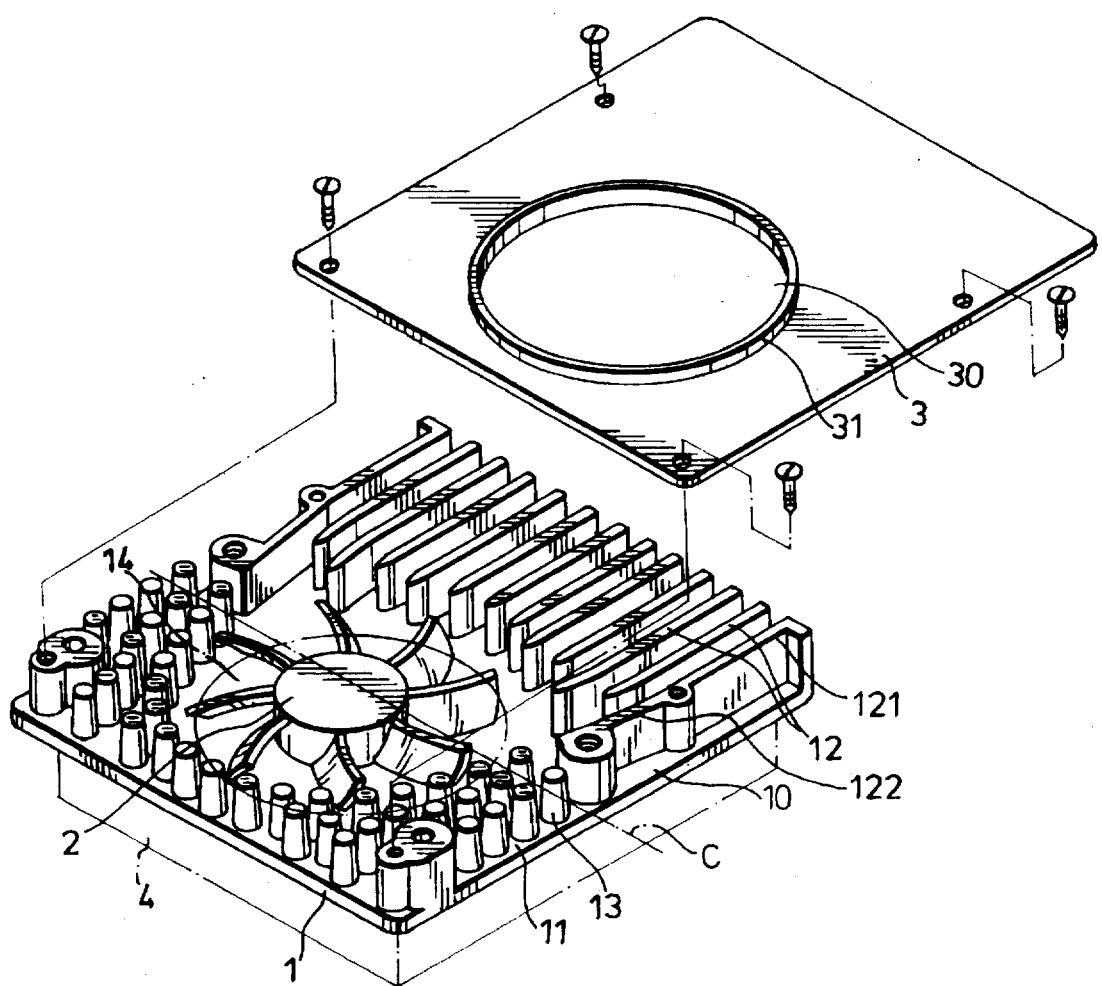
FIG. 6 is a partly exploded view of the preferred embodiment of a CPU heat dissipating device according to this invention.
Figure 7:
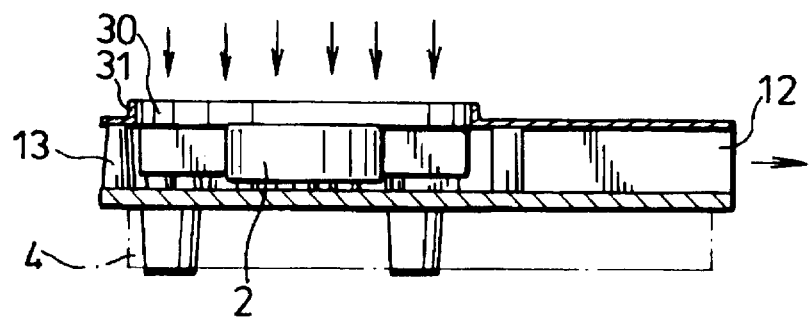
FIG. 7 is a sectional view showing the CPU heat dissipating device according to this invention.

Referring to FIGS. 6 and 7, the preferred embodiment of a CPU heat dissipating device of this invention includes a rectangular heat-conducting base plate 1 made of Aluminum and adapted to be fixed on a CPU 4, a air-drawing fan 2 fixed on the flat top surface of the base plate 1, and a guide plate 3 bolted to the top surface of the base plate 1.

The base plate 1 is divided by a middle line (C) into two rectangular plate sections 10, 11 and is provided with an annular fin unit which is disposed on the entire outer periphery of the top surface of the base plate 1 and which includes a first subunit or hot-air guiding unit consisting of a row of generally parallel rib-shaped radiating fins 12, and a second subunit consisting of a plurality of generally cylindrical radiating fins 13. The rib-shaped radiating fins 12 project integrally and upwardly from the plate section 10 of the base plate 1, while the cylindrical radiating fins 13 project integrally and upwardly from the plate section 11 of the base plate 1 and are arranged in a U-shaped formation so as to define between the fins 12 and 13 a generally circular fan-mounting space 14 in which the fan 2 is mounted. The fins 12, 13 are annularly arranged on the base plate 1 so as to surround the fan 2.

The rib-shaped radiating fins 12 are generally perpendicular to the middle line (C) so as to guide a little of hot air to depart from the base plate 1 via the hot-air passages defined by the fins 12. As illustrated, the outermost two rib-shaped radiating fins 12 are longer than the remaining rib-shaped radiating fins 12. Each of the outermost two rib-shaped radiating fins 12 has a straight outer section 121 perpendicular to the middle line (C), and a straight inner section 122 coupled with and bent somewhat inwardly from the outer section 121 so as to guide the hot air, blown by the fan 2 onto the inner section 122, to depart from the base plate 1 along the outermost fin 12.

Preferably, the distance between the fan 2 and any of the fins 12, 13 is greater than a predetermined distance of 0.5 mm.

The guide plate 3 is located immediately over the fins 12, 13 so as to cover the same and has an opening 30 formed therethrough and bordered by an annular flange 31 which projects integrally and upwardly from the guide plate 3 and which is located immediately over the fan 2 so as to guide cooling air to flow onto the base plate 1 in a direction perpendicular to the top surface of the base plate 1, thereby reducing turbulence between the guide plate 3 and the base plate 1.

Figure 8:
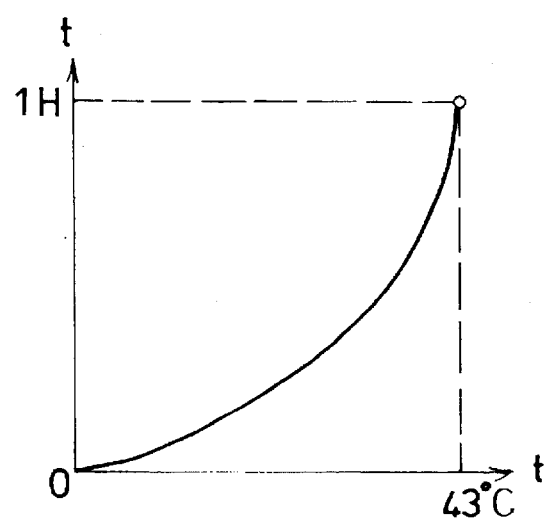
FIG. 8 is a diagram illustrating the relationship between the dissipating time of the CPU heat dissipating device according to this invention and the temperature of a CPU to which the device of this invention is applied, wherein (T) represents the time, and (t) represents the temperature.

As illustrated in FIG. 8, after the CPU heat dissipating device of this invention is used under a room temperature of 25° C. for about an hour, the CPU is at a temperature of about 43° C. As a result, the device of this invention has a higher efficiency as compared to the aforementioned prior art so as to prolong the service life of the CPU.

It can be appreciated that irregular arrangement of the cylindrical radiating fins 13 can increase the hot-air discharging rate of the device.

With this invention thus explained, it is apparent that numerous modifications and variations can be made without departing from the scope and spirit of this invention. It is therefore intended that this invention be limited only as indicated in the appended claims.

We claim:

1. A CPU heat dissipating device comprising:

a heat-conducting base plate adapted to be mounted on a CPU and having a flat top surface;

an annular fin unit mounted on said top surface of said base plate and projecting integrally and upwardly from entire outer periphery of said base plate;

an air-drawing fan mounted on said top surface of said base plate and located inside said annular fin unit; and a guide plate fixed on said base plate and located immediately over said annular fin unit so as to cover said annular fin unit, said guide plate having an opening which is formed therethrough and located immediately over said fan, and an annular flange which projects integrally and upwardly from said base plate and which is located around and adjacent to said opening so as to guide cooling air to flow onto said top surface of said base plate in a direction perpendicular to said top surface of said base plate, thereby reducing turbulence between said base plate and said guide plate.

2. A CPU heat dissipating device as claimed in claim 1, wherein said base plate is rectangular and has a middle line which divides said base plate into two rectangular plate sections, said annular fin unit including a first fin subunit and a second subunit between which said fan is located, said first subunit including a row of generally parallel rib-shaped radiating fins which project from one of said rectangular plate sections of said base plate and which are generally perpendicular to said middle line so as to guide a little of hot air to depart from said base plate in a direction perpendicular to said middle line, said second subunit including a plurality of cylindrical radiating fins which project from the other one of said rectangular plate sections of said base plate and which are arranged in a U-shaped formation.

3. A CPU heat dissipating device as claimed in claim 2, wherein outermost two of said rib-shaped radiating fins are longer than remainder of said rib-shaped radiating fins, each of the outermost two of said rib-shaped radiating fins having a straight outer section perpendicular to said middle line, and a straight inner section which is coupled with and bent somewhat inwardly from said outer section so that hot air from said fan can flow out from said base therealong.

4. A CPU heat dissipating device as claimed in claim 3, wherein distance between said fan and any of said rib-shaped radiating fins and said cylindrical radiating fins is greater than a predetermined distance.

5. A CPU heat dissipating device as claimed in claim 4, wherein said predetermined distance is 0.5 mm.

* * * * *